(12) United States Patent
Kimura

(10) Patent No.: US 11,531,351 B2
(45) Date of Patent: Dec. 20, 2022

(54) LIGHT RECEIVING ELEMENT ARRAY, LIGHT DETECTION APPARATUS, DRIVING SUPPORT SYSTEM, AND AUTOMATED DRIVING SYSTEM

(71) Applicant: DENSO CORPORATION, Kariya (JP)

(72) Inventor: Shunsuke Kimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 330 days.

(21) Appl. No.: 16/782,476

(22) Filed: Feb. 5, 2020

(65) Prior Publication Data

US 2020/0174122 A1 Jun. 4, 2020

Related U.S. Application Data

(63) Continuation of application No. PCT/JP2018/029382, filed on Aug. 6, 2018.

(30) Foreign Application Priority Data

Aug. 8, 2017 (JP) .............................. JP2017-153462

(51) Int. Cl.

| | |
|---|---|
| *G03F 7/20* | (2006.01) |
| *G05D 1/02* | (2020.01) |
| *G01S 17/931* | (2020.01) |
| *G01S 7/481* | (2006.01) |
| *G01S 17/10* | (2020.01) |
| *G01S 17/89* | (2020.01) |
| *H04N 5/225* | (2006.01) |

(Continued)

(52) U.S. Cl.
CPC ........... *G05D 1/0231* (2013.01); *G01S 7/4816* (2013.01); *G01S 17/10* (2013.01); *G01S 17/89* (2013.01); *G01S 17/931* (2020.01); *H01L 27/14643* (2013.01); *H01L 31/107* (2013.01); *H01L 31/147* (2013.01); *H04N 5/2256* (2013.01); *H04N 5/23245* (2013.01); *G01S 7/4804* (2013.01); *G05D 1/0246* (2013.01); *H01L 31/10* (2013.01)

(58) Field of Classification Search
CPC .. G05D 1/0231; G05D 1/0246; G01S 7/4816; G01S 17/10; G01S 17/89; G01S 17/931; G01S 7/4804; G01S 7/4863; G01S 7/4817; G01S 17/86; G01S 17/42; G01S 7/4815; G01S 7/484; H01L 27/14643; H01L 31/107; H01L 31/147; H01L 31/10; H04N 5/2256; H04N 5/23245; H04N 5/36965; H04N 5/35554; H04N 5/37457; G02B 26/105; B60Q 1/02; B60Q 1/2696; H05B 47/115; Y02B 20/40

See application file for complete search history.

(56) References Cited

U.S. PATENT DOCUMENTS

| | | | |
|---|---|---|---|
| 6,831,692 | B1 | 12/2004 | Oda |
| 2008/0158043 | A1 | 7/2008 | Ishio et al. |
| 2014/0118730 | A1* | 5/2014 | Kavaldjiev ......... H01L 27/1446 257/438 |

FOREIGN PATENT DOCUMENTS

| | | |
|---|---|---|
| JP | 2000-125209 A | 4/2000 |
| JP | 2007-103461 A | 4/2007 |

(Continued)

*Primary Examiner* — Mesfin T Asfaw
(74) *Attorney, Agent, or Firm* — Maschoff Brennan

(57) ABSTRACT

A light receiving element array includes one or more unit element blocks. Each of the unit element blocks includes different light receiving elements with different element structures.

10 Claims, 15 Drawing Sheets

(51) Int. Cl.
*H04N 5/232* (2006.01)
*H01L 31/107* (2006.01)
*H01L 31/147* (2006.01)
*H01L 27/146* (2006.01)
G01S 7/48 (2006.01)
H01L 31/10 (2006.01)

(56) References Cited

FOREIGN PATENT DOCUMENTS

| | | |
|---|---|---|
| JP | 2007-300054 A | 11/2007 |
| JP | 2015-510259 A | 4/2015 |
| JP | 2016-146417 A | 8/2016 |
| JP | 2016-217907 A | 12/2016 |
| JP | 2017-044530 A | 3/2017 |
| WO | 2017-110559 A1 | 6/2017 |

\* cited by examiner

LIGHT RECEIVING ELEMENT ARRAY, LIGHT DETECTION APPARATUS, DRIVING SUPPORT SYSTEM, AND AUTOMATED DRIVING SYSTEM

CROSS-REFERENCE TO RELATED APPLICATION

This application is the U.S. bypass application of International Application No. PCT/JP2018/029382, filed Aug. 6, 2018 which designated the U.S. and claims priority to Japanese Patent Application No. 2017-153462, filed Aug. 8, 2017, the contents of which are incorporated herein by reference.

TECHNICAL FIELD

The present disclosure relates to a light receiving element array used for distance measurement and imaging, a light detection apparatus that uses the light receiving element array, and various systems that use the light detection apparatus.

BACKGROUND

A vehicle is equipped with various sensors for obtaining various kinds of information used for driving support to the driver. Among them, a sensor is known to generate a range image by a time-of-flight (i.e., TOF) method for measuring the time from light irradiation to receipt of the reflected light. This kind of sensor detects various targets such as fallen objects on the road, vehicles traveling ahead, and pedestrians. The ranges to the targets to be detected also vary from short to long distances. Thus, the light receiving element needs to have a wide dynamic range.

SUMMARY

A light receiving element array according to an aspect of the present disclosure includes one or more unit element blocks. Each of the unit element blocks includes a plurality of light receiving elements with different element structures.

A light detection apparatus according to an aspect of the present disclosure includes a light emitting section, a light receiving element array, and a distance measurement unit.

The light emitting section emits light to a preset sensing area. The light receiving element array includes one or more unit element blocks for receiving light coming from the sensing area. Each of the unit element blocks includes a first element which is a photodiode with an electron multiplying function, and a second element which is a photodiode without the electron multiplying function. The distance measurement unit measures the distance using a detection signal read from the light receiving element array.

BRIEF DESCRIPTION OF THE DRAWINGS

The above objects and other objects, features and advantages of the present disclosure will be made clearer by the following detailed description, given referring to the appended drawings. In the accompanying drawings.

DETAILED DESCRIPTION OF THE PREFERRED EMBODIMENTS

In response to the needs described above, JP 2000-125209 A discloses a technique for extending the dynamic range of a light receiving element array including a plurality of arranged photodiodes. The dynamic range is extended by combining photodiodes that have different sensitivity levels achieved by varying the size of the light receiving surfaces.

However, detailed research carried out by the present inventors has revealed that the known technique described in JP 2000-125209 A has a problem below.

More specifically, since the photodiodes in the known technique have different sizes and the same properties, the dynamic range can be easily extended toward lower sensitivity by reducing the element sizes of the photodiodes. In contrast, the dynamic range is difficult to extend toward higher sensitivity because the light receiving element array increases in size with the element sizes of the photodiodes.

The present disclosure has been made in view of the above circumstances, and has an object to provide a technique for extending a distance dynamic range for measurement with a light receiving element array.

A light receiving element array according to an aspect of the present disclosure includes one or more unit element blocks. Each of the unit element blocks includes a plurality of light receiving elements with different element structures.

This structure includes a combination of different light receiving elements having different sensitivity levels or other properties due to different element structures. The light receiving element array with this structure can thus provide a wide dynamic range without changing the size of each light receiving element.

A light detection apparatus according to another aspect of the present disclosure includes a light emitting section, a light receiving element array, and a distance measurement unit.

The light emitting section emits light to a preset sensing area. The light receiving element array includes one or more unit element blocks for receiving light coming from the sensing area. Each of the unit element blocks includes a first element which is a photodiode with an electron multiplying function, and a second element which is a photodiode without the electron multiplying function. The distance measurement unit measures the distance using a detection signal read from the light receiving element array.

The light detection apparatus with this structure can extend the dynamic range toward higher sensitivity without varying the size of each light receiving element, unlike a case in which only photodiodes form light receiving elements with different sensitivity levels. As a result, the distance measurement capability can be improved.

Embodiments of the present disclosure will now be described with reference to the drawings.

1. First Embodiment

[1-1. Configuration]

Figure 1:
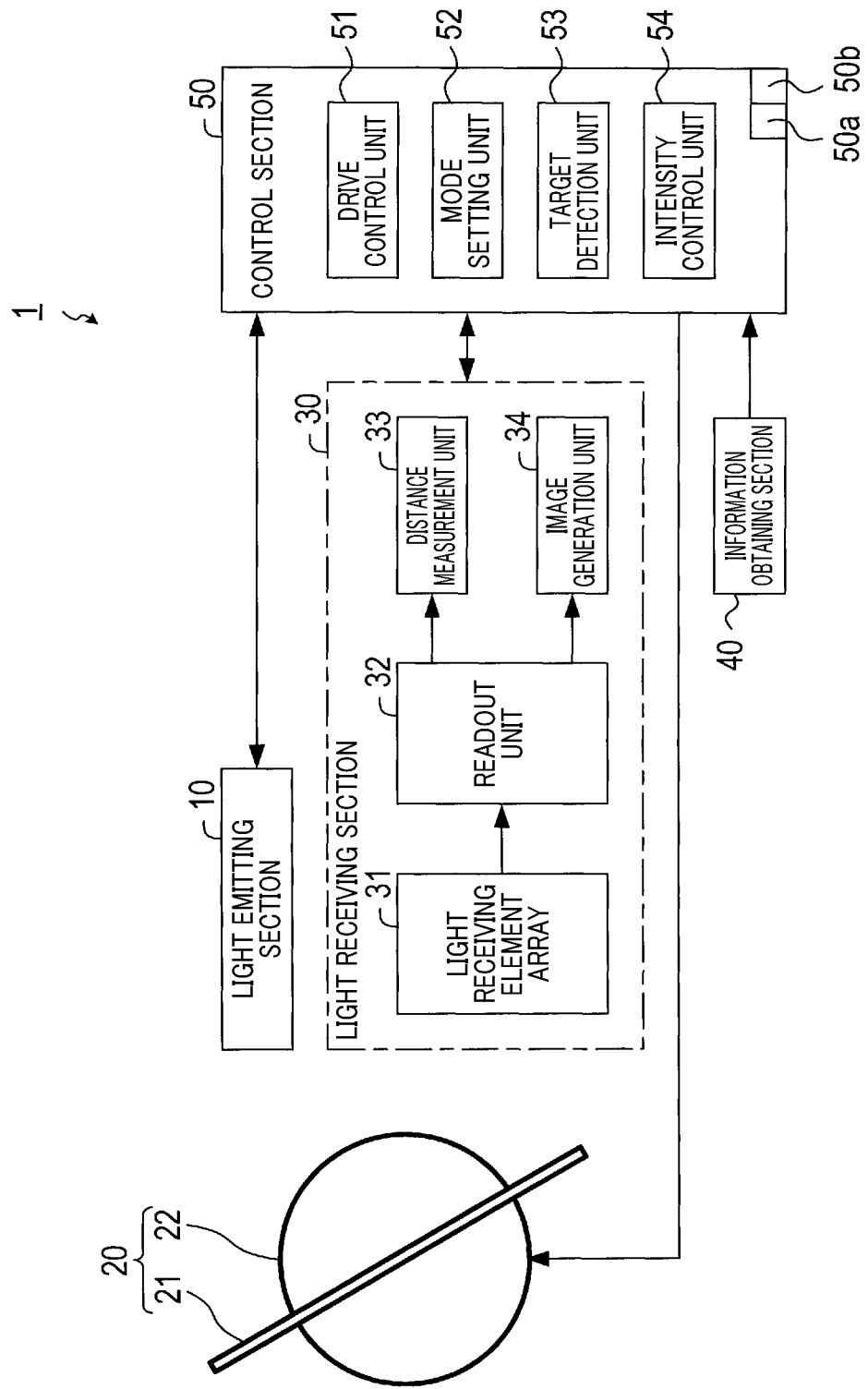
FIG. 1 is a block diagram illustrating the configuration of a light detection apparatus according to a first embodiment.

A light detection apparatus 1 illustrated in FIG. 1 includes a light receiving section 30. The light detection apparatus 1 may also include a light emitting section 10, a scanning section 20, an information obtaining section 40, and a control section 50. The light receiving section 30 may be a one-chip semiconductor integrated circuit. The semiconductor integrated circuit may include the light emitting section 10.

[1-1-1. Light Emitting Section]

The light emitting section 10 includes a light emitting element such as a laser diode. The light emitting section 10 repeatedly emits a pulsed laser beam (hereinafter, irradiation light) in accordance with a light emission trigger, which is an instruction from the control section 50. The light emitting element has variable light emission intensity that depends on an instruction from the control section 50. For example, the light emission intensity may be switched between two types: high output and low output.

[1-1-2. Scanning Section]

The scanning section 20 includes a mirror unit 21 and a drive unit 22.

The mirror unit 21 is plate-like in shape, and both sides thereof are used as reflective surfaces. The mirror unit 21 reflects irradiation light from the light emitting section 10 in the direction corresponding to the rotation angle of the mirror unit 21. The mirror unit 21 also receives the reflected light of the irradiation light reflected by a target and coming in the direction corresponding to the rotation angle of the mirror unit 21, and reflects the received light onto the light receiving section 30.

The drive unit 22 drives the rotation of the mirror unit 21 in accordance with an instruction from the control section 50. As a result, a sensing area with an angular range predefined in a horizontal plane is scanned with the irradiation light applied from the light emitting section 10 via the mirror unit 21. The horizontal plane is orthogonal to the rotation axis of the mirror unit 21.

[1-1-3. Light Receiving Section]

The light receiving section 30 includes a light receiving element array 31, a readout unit 32, a distance measurement unit 33, and an image generation unit 34.

Figure 2:
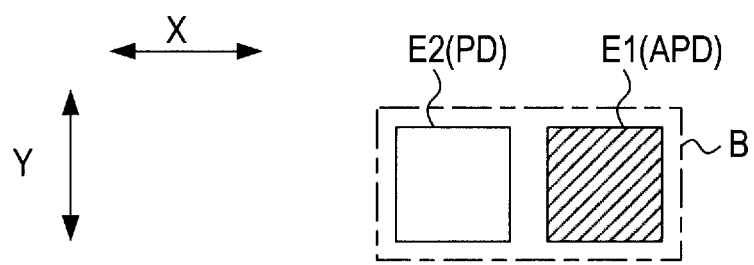
FIG. 2 illustrates the structure of a unit element block included in a light receiving element array.

As shown in FIG. 2, the light receiving element array 31 includes at least one unit element block B. The unit element block B includes a first element E1 and a second element E2 that have different element structures. The first element E1 and the second element E2 are arranged in a preset element arrangement direction X. The light receiving element array 31 is installed in the vehicle provided with the apparatus 1 in a manner to align the element arrangement direction X with the vehicle width direction, or the horizontal direction, and align the direction Y, orthogonal to the element arrangement direction X, with the vehicle height direction, or the vertical direction in the emitting surfaces of the first element E1 and the second element E2.

For a plurality of unit element blocks B, the unit element blocks B may be arranged along any one of the direction X and the direction Y in a one-dimensional manner or along both the direction X and the direction Y in a two-dimensional manner. The number and arrangement of unit element blocks B are determined as appropriate depending on the structures of the light emitting section 10 and the scanning section 20 and their positional relationship.

The first element E1 is, for example, an avalanche photodiode, which has an electron multiplying function. The second element E2 is, for example, a typical photodiode such as an embedded photodiode, which has no electron multiplying function, or a positive-intrinsic-negative (PIN) photodiode. The first element E1 and the second element E2 have rectangular light receiving surfaces of the same size. The first element E1 is higher in sensitivity than the second element E2.

Referring back to FIG. 1, the distance measurement unit 33 calculates the distance to the target that has reflected the irradiation light from the light emitting section 10. The calculation is based on sampled data on detection signals Sa and Sp read from the light receiving element array 31 and received via the readout unit 32 and on a light emission trigger output from the control section 50 to the light emitting section 10. The distance calculation is achieved by a time-of-flight method, or TOF method.

The image generation unit 34 generates a captured image of a sensing area based on sampled data about a detection signal Sc representing the amount of electric charge accumulated during a preset shutter release time and received via the readout unit 32.

Figure 3:
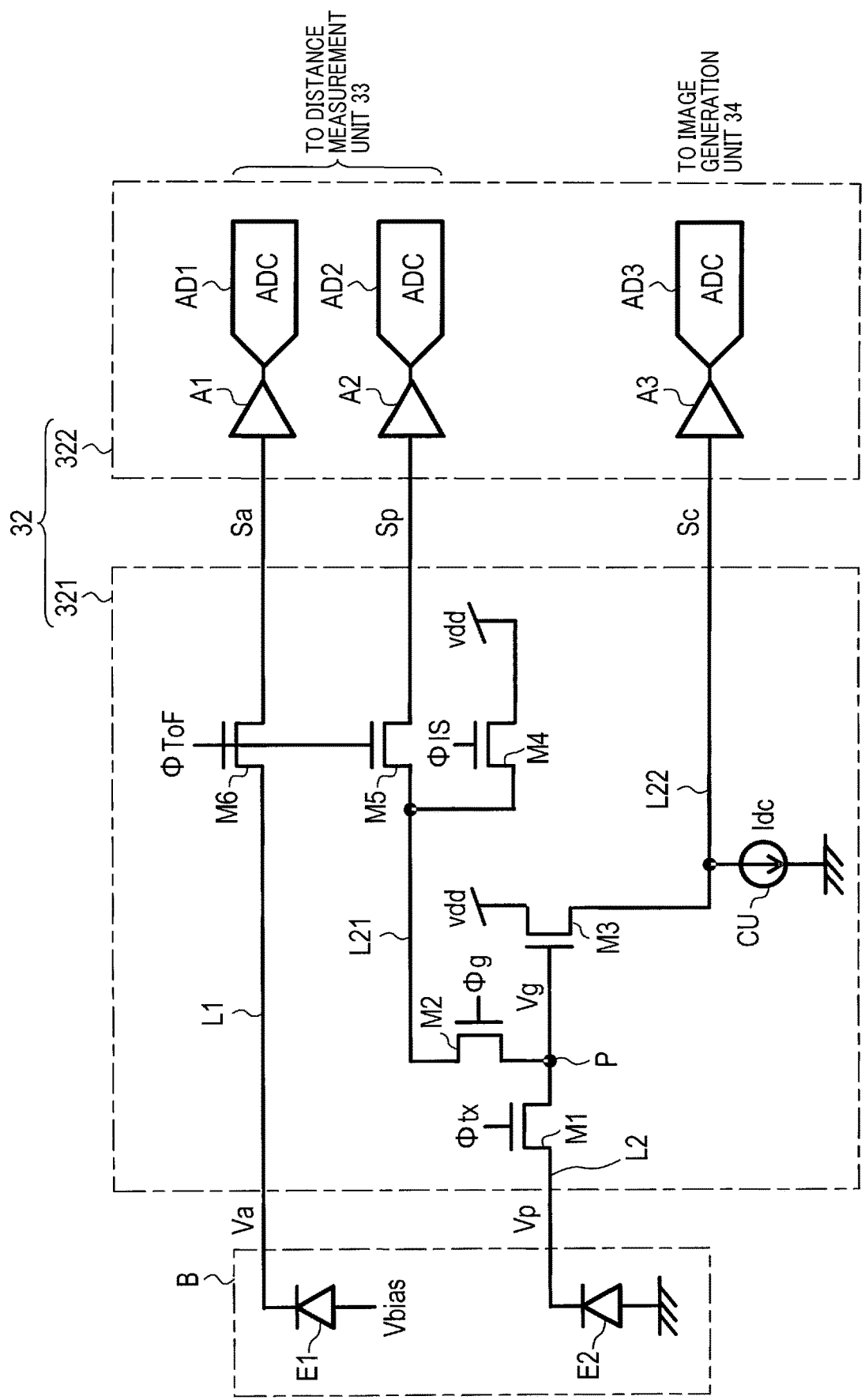
FIG. 3 is a circuit diagram illustrating the structure of a readout unit.

As shown in FIG. 3, the readout unit 32 includes a unit circuit 321 and an AD conversion portion 322 that are associated with each unit element block B.

The AD conversion portion 322 includes three amplifiers A1, A2, and A3 and three AD converters AD1, AD2, and AD3. The AD conversion portion 322 causes the amplifiers A1 and A2 to respectively amplify two detection signals Sa and Sp output from the unit circuit 321, and the AD converters AD1 and AD2 convert the amplified analog signals to digital form. The AD conversion portion 322 outputs the resultant digital signals to the distance measurement unit 33. The AD conversion portion 322 also causes the amplifier A3 to amplify the detection signal Sc output from the unit circuit 321, and the AD converter AD3 converts the amplified analog signal to digital form. The AD conversion portion 322 outputs the resultant digital signal to the image generation unit 34.

The unit circuit 321 includes six transistors M1 to M6 and a constant current circuit CU.

The transistor M6 is installed on a path L1 from the cathode of the first element E1 to the amplifier A1, and establishes or breaks the electrical connection through the path L1 in accordance with a control signal φTOF.

The transistor M1 is installed on a path L2 from the cathode of the second element E2 to a junction point P, and establishes or breaks the electrical connection through the path L2 in accordance with a control signal φtx.

The transistors M2 and M5 are installed in series on a path L21 from the junction point P to the amplifier A2. The transistor M2 establishes or breaks the electrical connection through the path L21 in accordance with a control signal 4g. The transistor M5 establishes or breaks the electrical connection through the path L21 in accordance with the control signal φTOF.

The transistor M4 is connected between the transistor M2 and the transistor M5, and establishes or breaks the electrical connection between the path L21 and the power supply line from a power supply voltage vdd in accordance with a control signal φIS.

The transistor M3 is installed on a path L22 from the junction point P to the amplifier A3, and amplifies a signal Vg fed through the path L2 to generate a signal Sc output to the amplifier A3.

The constant current circuit CU applies a constant bias current Idc to the transistor M3. In other words, the detection signal Sc has a signal level that varies depending on the potential determined in accordance with the bias current Idc.

[1-1-4. Information Obtaining Unit]

Referring back to FIG. 1, the information obtaining section 40 obtains information about the behavior of the vehicle and the environment around the vehicle via an on-vehicle LAN, from various on-vehicle sensors or a wireless communications device that communicates with the outside of the vehicle. Examples of the information obtained by the information obtaining section 40 may include vehicle speed information indicating the velocity of the vehicle, and traffic jam information about the road being traveled by the vehicle.

[1-1-5. Control Section]

The control section 50 includes a micro-computer including a CPU 50a and semiconductor memory (hereinafter, memory 50b) such as RAM or ROM. The functions of the control section 50 are implemented by the CPU 50a executing programs stored in a non-transitory tangible recording medium. In this example, the memory 50b corresponds to the non-transitory tangible recording medium storing the programs. The execution of the programs implements the methods corresponding to the programs. The control section 50 may include a single micro-computer or a plurality of micro-computers. Each function of the control section 50 may not be implemented by software. The functions of the control section 50 may be partially or entirely implemented by one or more pieces of hardware. For example, if the functions are implemented by an electronic circuit, which is hardware, the electronic circuit may be a digital circuit, an analog circuit, or a combination of these circuits.

The control section 50 also includes functional units: a drive control unit 51, a mode setting unit 52, a target detection unit 53, and an intensity control unit 54.

The mode setting unit 52 sets the operation mode of the light detection apparatus 1 at any one of a distance measuring mode and an imaging mode. The distance measuring mode is an operation mode that causes the light detection apparatus 1 to operate as a LIDAR system. LIDAR is an abbreviation of light detection and ranging. The imaging mode is an operation mode that causes the light detection apparatus 1 to operate as a camera.

Hereinafter, a period of time during which the operation mode is set at the distance measuring mode is referred to as a measurement period, whereas a period of time during which the operation mode is set at the imaging mode is referred to as an imaging period. The measurement period is set to correspond to a length equal to or greater than a time taken for light to travel a preset maximum sensing distance and return. The imaging period is set to correspond to a length equal to or greater than a time taken from when the second element E2 starts operating as an image sensor to when signals are read from the image sensor. The lengths of the measurement period and the imaging period may be the same or different.

The mode setting unit 52 alternates the distance measuring mode and the imaging mode at the end of the set period of each mode.

The drive control unit 51 generates various control signals for each operation mode to control the operation of the light emitting section 10, the scanning section 20, and the light receiving section 30.

The drive control unit 51 actuates the scanning section 20 so that the distance measuring mode and the imaging mode are each repeated M times during a half turn of the mirror unit 21. As a result, the M divisions of the sensing area are scanned for each half turn of the mirror unit 21, and each of the M divisions of the sensing area experiences distance measurement and imaging. Hereinafter, the M divisions of the sensing area are referred to as azimuth 1 to azimuth M.

In the distance measuring mode, the drive control unit 51 causes the light emitting section 10 to emit a laser beam at the start of the distance measuring mode. The drive control unit 51 also controls the light receiving section 30. In this control, the first element E1 and the second element E2 receive the reflected light of the irradiation light reflected by a target, and the waveforms of the detection signals Sa and Sp from the first element E1 and the second element E2 are sampled at predetermined intervals and output to the distance measurement unit 33.

In the imaging mode, the drive control unit 51 causes the second element E2 to operate as the image sensor without causing the light emitting section 10 to emit a laser beam. The drive control unit 51 also controls the light receiving section 30 so that a reference level and the signal level indicating the amount of electric charge accumulated during the shutter release time are sampled and output to the image generation unit 34. In this control, the reference level is a signal level observed when the electric charge accumulated on the image sensor is reset.

The control performed by the drive control unit 51 will now be described in detail with reference to FIGS. 3 and 4.

When the operation mode is the distance measuring mode, a laser beam is emitted at the start of the measurement period in accordance with the light emission trigger, and reflected light from a target within the maximum sensing distance is received by the light receiving element array 31 during the measurement period. At this time, the cathode potentials of the first element E1 and the second element E2 change in accordance with the received light intensity of the reflected light. Although the transistors M1, M2, and M4 to M6 are turned on and off in accordance with the control signals φtx, φg, φIS, and φTOF, the control signals will not be described, but the results of the on-off control for the transistors will be described below.

Figure 5:
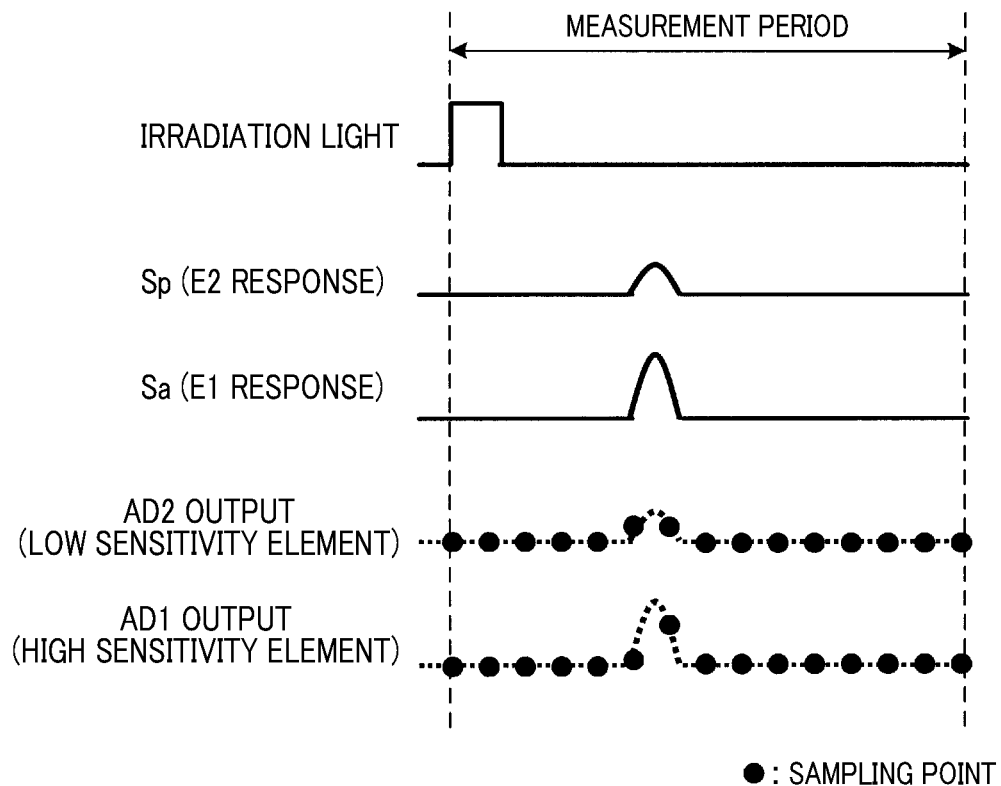
FIG. 5 illustrates the waveforms and the sampling timings of detection signals to be subjected to AD conversion.

In the distance measuring mode, the transistors M1, M2, M5, and M6 are turned on while the transistor M4 is turned off throughout the measurement period. In this state, the path L1 from the first element E1 to the amplifier A1 conducts an electric current, and thus the first element E1 outputs a detection signal Sa depending on its cathode potential Va to the AD conversion portion 322. The paths L2 and L21 from the second element E2 to the amplifier A2 also conduct an electric current, and thus the second element E2 outputs a detection signal Sp depending on its cathode potential Vp to the AD conversion portion 322. The AD conversion portion 322 samples the detection signals Sa and Sp at regular intervals over the entire measurement period, as shown in FIG. 5. As a result, the digital data indicating the waveforms of the detection signals Sa and Sp is output to the distance measurement unit 33.

Figure 4:
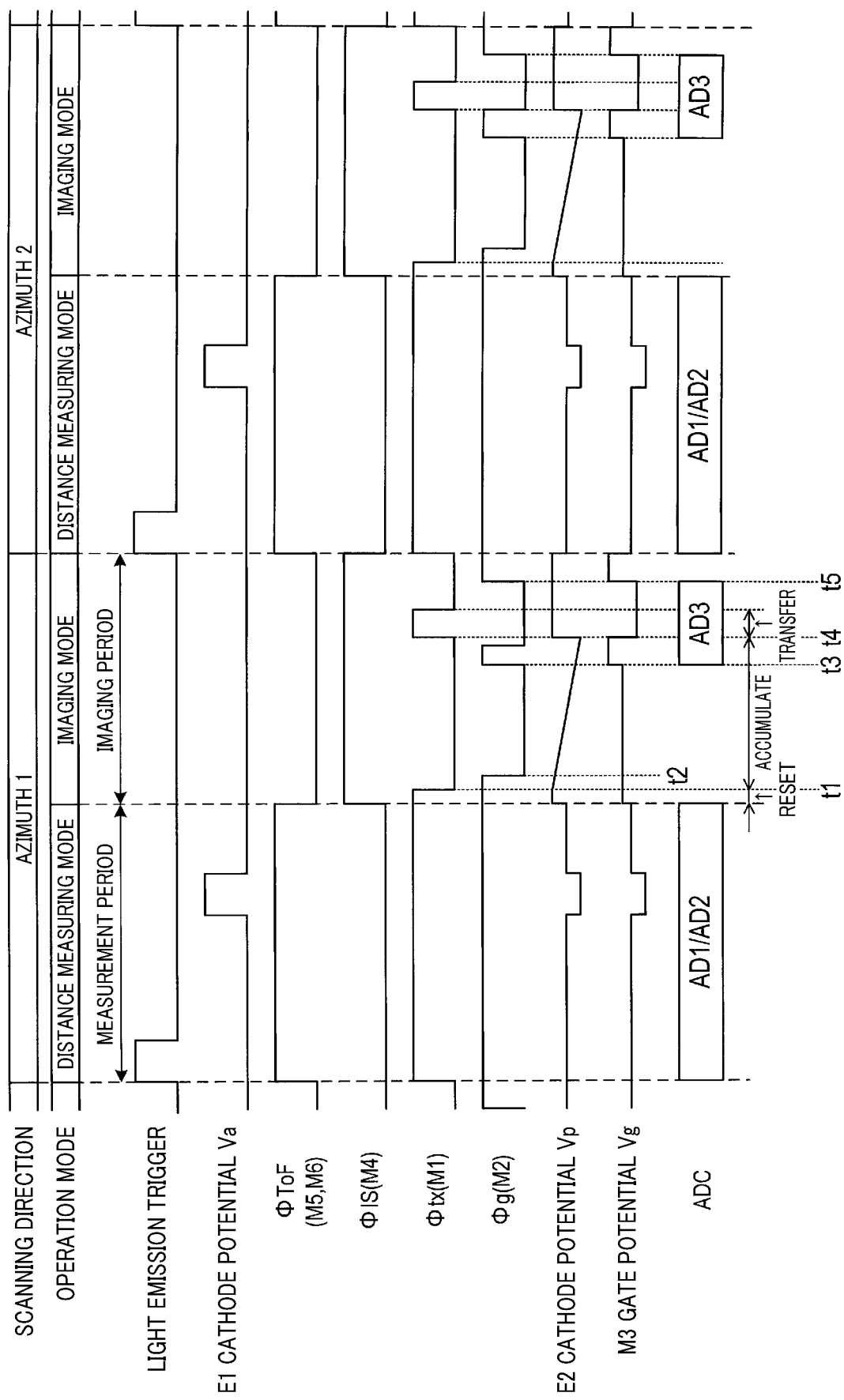
FIG. 4 is a timing chart illustrating the operation of a readout unit achieved through the control by a drive control unit.

When the operation mode is the imaging mode, as shown in FIG. 4, the transistors M5 and M6 are turned off while the transistor M4 is turned on over the imaging period, during which the light emitting section 10 emits no light. In the imaging mode, the transistor M3 amplifies the potential of the junction point P, and the resultant detection signal Sc is output to the AD conversion portion 322.

After the distance measuring mode is switched to the imaging mode, the transistor M1 remains on until time t1, and is then turned off. Similarly, the transistor M2 remains on until time t2, later than time t1, and is then turned off.

Until time t1 at which the transistors M1, M2, and M4 remain on, the potential Vp of the cathode of the second element E2 and the potential Vg at the junction point P are reset by the power supply voltage vdd. When the transistor M1 is turned off at time t1, the cathode of the second element E2 starts accumulating electric charge in accordance with the received light intensity.

Then, the transistor M2 remains off until time t3, and is temporarily turned on until immediately before time t4. At this time, the potential of the junction point P is reset again. The signal level of the detection signal Sc indicating the reset potential Vg of the junction point P is sampled by the AD converter AD3 as the reference level.

The transistor M1 remains off from time t1 to time t4, and is then temporarily turned on. The time period from time t1 to time t4 is also referred to as the shutter release period. When the transistor M1 is turned on at time t4, the electric charge accumulated on the cathode of the second element E2 is transferred to the junction point P and thus the gate of the transistor M3. As a result, the detection signal Sc has a signal level corresponding to the amount of electric charge accumulated by the second element E2 during the shutter release period. The signal level of the detection signal Sc at this time is sampled by the AD converter AD3 as the detection level.

Then, the transistor M2 is turned on at time t5, and the transistor M1 is turned on at the end of the imaging period.

After that, the same process is repeated for each sequential shift in the scanning directions, or azimuth 1 to azimuth M, in accordance with the rotational position of the mirror unit 21.

The distance measurement unit 33 extracts the reflected light reception time from the digital data output from the readout unit 32 during the measurement period and indicating the waveforms of the detection signals Sa and Sp. Based on the time between the light reception time and the time of the irradiation by the light emitting section 10, the distance measurement unit 33 calculates the distance to the target that has reflected the irradiation light. The distance measurement unit 33 also arranges the distance calculation results in association with azimuth 1 to azimuth M to generate a range image.

When extracting the light reception time, the distance measurement unit 33 may determine whether the detection signal Sa from the high-sensitivity first element E1 is saturated. If not saturated, the detection signal Sa may be used. If the detection signal Sa is saturated, the detection signal Sp may be used.

The image generation unit 34 calculates pixel values by subtracting the reference level from the detection level of the detection signal Sc output from the readout unit 32 during the imaging period. The image generation unit 34 also arranges the calculated pixel values in association with azimuth 1 to azimuth M to generate a captured image.

Referring back to FIG. 1, each time the distance measurement unit 33 and the image generation unit 34 generate the range image and the captured image over the sensing area, the target detection unit 53 uses the range image and the captured image to detect targets within the sensing area. For each of the detected targets, the target detection unit 53 also generates target information including the type and the position of the target.

Figure 6:
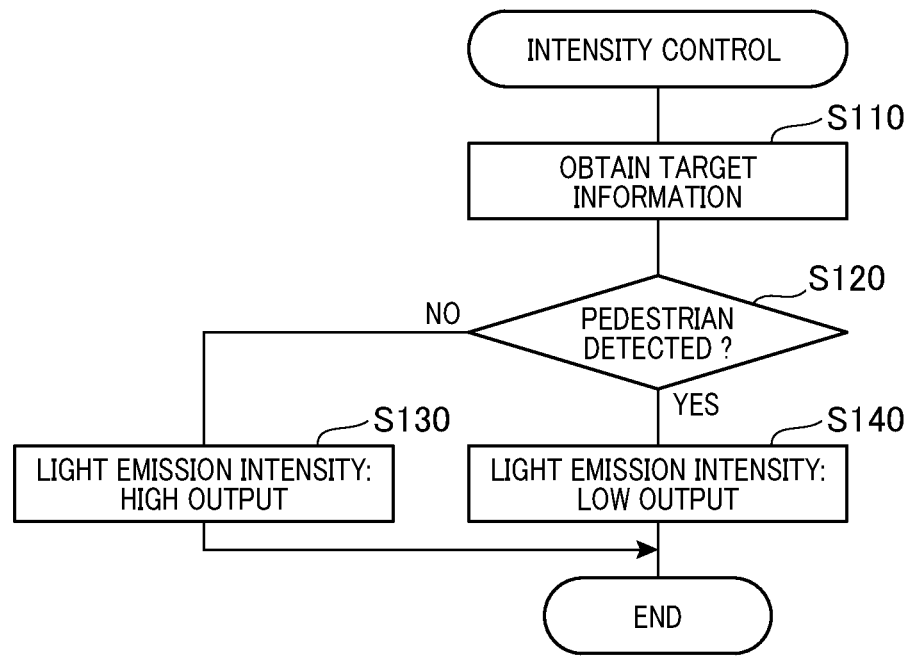
FIG. 6 is a flowchart of an intensity control procedure.

The intensity control unit 54 uses the target information generated by the target detection unit 53 to control the light emission intensity of the light emitting section 10. The intensity control procedure performed by the intensity control unit 54 will now be described with reference to FIG. 6.

This procedure is started each time the target detection unit 53 generates target information.

When this procedure is started, the intensity control unit 54 obtains the target information generated by the target detection unit 53 in S110.

In S120, the intensity control unit 54 determines whether a pedestrian has been detected, based on the target type included in the obtained target information. If the result is negative in S120, the intensity control unit 54 proceeds to S130. If the result is positive, the intensity control unit 54 proceeds to S140.

In S130, the intensity control unit 54 sets the light emission intensity at high output, and finishes the procedure.

In S140, the intensity control unit 54 sets the light emission intensity at low output, and finishes the procedure.

After the light emission intensity setting is changed in S130 or S140, the light emission intensity of the light emitting section 10 is changed at the start of the distance measuring mode for azimuth 1.

[1-2. Effects]

According to the first embodiment described in detail above, the following effects are achieved.

(1a) In the light detection apparatus 1, the unit element block B in the light receiving element array 31 includes the first element E1 and the second element E2 with different sensitivity levels, and both the first element E1 and the second element E2 are used to measure a distance. Thus, the light detection apparatus 1 achieves a wide dynamic range for distance measurement.

Moreover, the first element E1 and the second element E2 used in the light detection apparatus 1 are an APD and a PD with different element structures. Thus, the light detection apparatus 1 can achieve a wider dynamic range without enlarging the area of the light receiving surface of each of the elements E1 and E2, as well as the APD enables the dynamic range to extend toward higher sensitivity.

(1b) The light detection apparatus 1 changes the light emission intensity of the light emitting section 10 depending on whether the sensing area includes a pedestrian, thus preventing a pedestrian from being irradiated with a high-output laser beam.

(1c) The light detection apparatus 1 has the distance measuring function (i.e., LIDAR) and the image generating function (i.e., camera) in the single apparatus, thus enabling the vehicle equipment installation space to be saved compared with the installation of separate apparatuses for both the functions.

(1d) The light detection apparatus 1, which includes the scanning section 20, enables the wide-angle LIDAR function and the wide-angle high-definition camera function to be provided by the light receiving element array 31 with a smaller number of light receiving elements.

[1-3. Modification]

Figure 7:
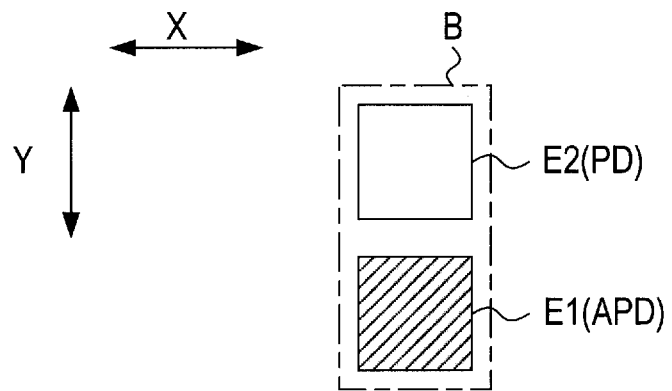
FIG. 7 illustrates another example arrangement of a first element and a second element in the unit element block.

In the embodiment described above, the first element E1 and the second element E2 included in the unit element block B are arranged along the direction X corresponding to the vehicle width direction. However, the present disclosure is not limited to this arrangement. For example, as shown in FIG. 7, the first element E1 and the second element E2 may also be arranged along the direction Y corresponding to the vehicle height direction.

Figure 8:
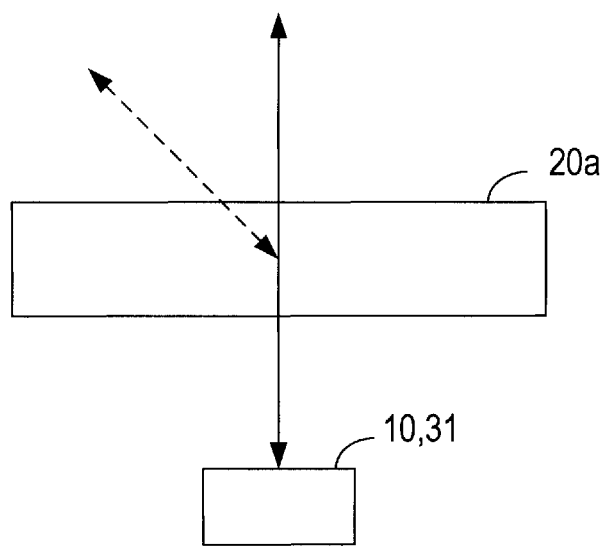
FIG. 8 illustrates another example structure of a scanning section.

In the embodiment described above, the scanning section 20 achieves a scan with irradiation light and reflected light by a mechanical method. However, the present disclosure is not limited to this method. For example, as shown in FIG. 8, the scanning section 20 may achieve a scan by an optical method for emitting a laser beam and receiving reflected waves through a voltage- or current-controllable light deflecting element 20a.

2. Second Embodiment

[2-1. Differences from First Embodiment]

A second embodiment is basically similar to the first embodiment, and thus differences will now be described. The same reference signs as in the first embodiment refer to the same components, for which see the preceding description.

The second embodiment is different from the first embodiment in a unit element block Ba and a unit circuit 321a, and the control performed by the drive control unit 51.

[2-2. Unit Element Block]

Figure 9:
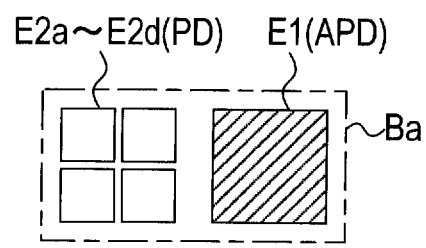
FIG. 9 illustrates the structure of a unit element block according to a second embodiment.

As shown in FIG. 9, the unit element block Ba has a structure in which the second element E2 of the unit element block B in the first embodiment is replaced with four second elements E2a to E2d.

The second elements E2a to E2d are of the same size and similar to the first element E1 in shape. The four second elements E2a to E2d arranged in a two-by-two matrix have substantially the same size as the first element E1.

In the same manner as in the first embodiment, the first element E1 is, for example, an avalanche photodiode, and the second elements E2a to E2d are typical photodiodes or PIN photodiodes. In addition, the second elements E2a to E2d may be covered with color filters to obtain color images.

[2-3. Unit Circuit]

The unit circuit 321a will now be described with reference to FIG. 10. Although the unit element block Ba includes the four second elements E2a to E2d, the two second elements E2c and E2d are omitted from FIG. 10 for visual clarity, with the unit element block Ba described as including the two second elements E2a and E2b.

Figure 10:
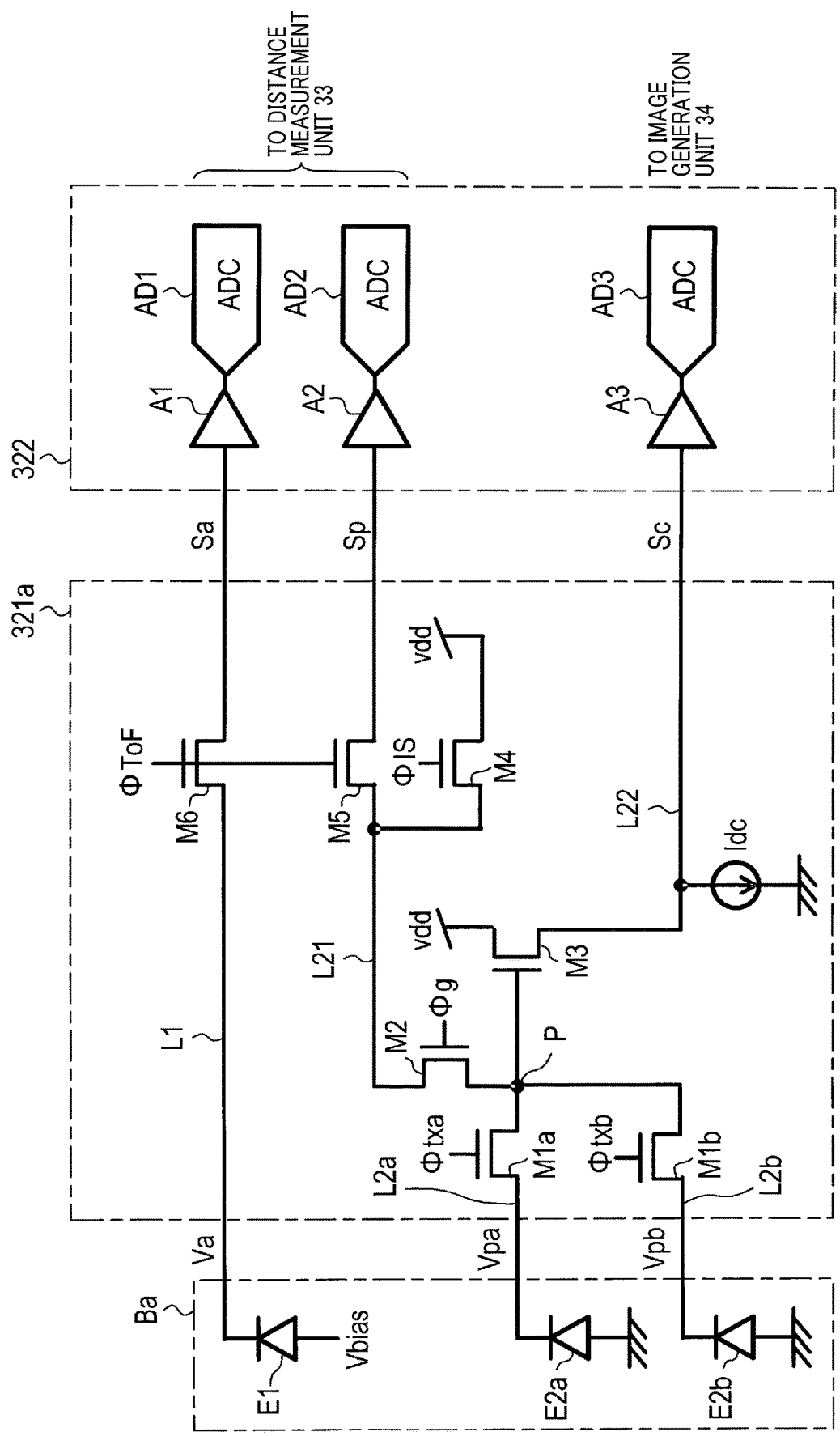
FIG. 10 is a circuit diagram illustrating a unit circuit according to the second embodiment.

As shown in FIG. 10, the unit circuit 321a includes two transistors M1a and M1b in place of the transistor M1.

The transistor M1a is installed on a path L2a from the second element E2a to the junction point P, and establishes or breaks the electrical connection through the path L2a in accordance with a control signal ϕtxa.

The transistor M1b is installed on a path L2b from the second element E2b to the junction point P, and establishes or breaks the electrical connection through the path L2b in accordance with a control signal ϕtxb.

[2-4. Drive Control Unit]

The drive control unit 51 operates the transistor M1a in place of the transistor M1 in the distance measuring mode and is otherwise similar to that in the first embodiment. In this control, not only the transistor M1a but also the transistor M2a may be operated at the same time.

Figure 11:
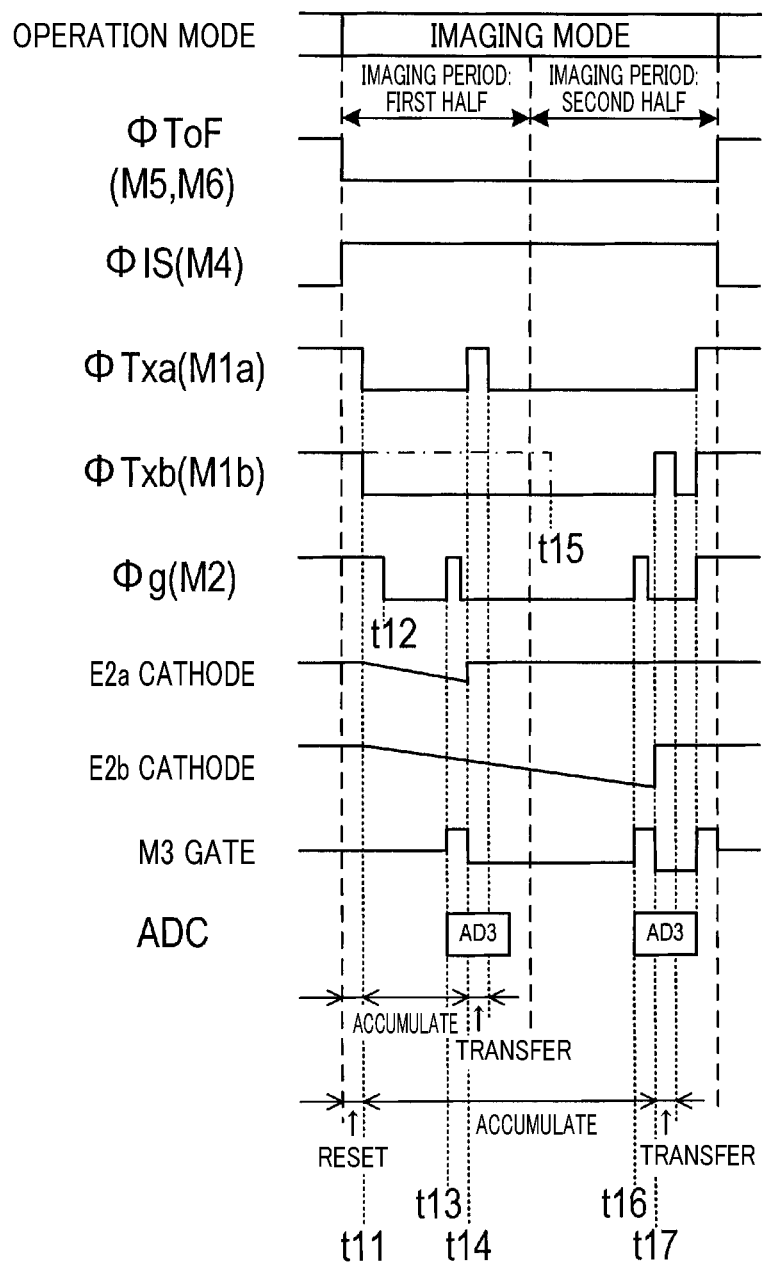
FIG. 11 is a timing chart illustrating the operation of a readout unit according to the second embodiment.

In the imaging mode, as shown in FIG. 11, the imaging period is divided into the first and second halves. In the first half, readout is performed from the second element E2a. In the second half, readout is performed from the second element E2b.

After the start of the imaging period, the transistor M2 is turned off at time t12, corresponding to time t2 in FIG. 4, and then temporarily turned on once within each of the first and second halves of the imaging period, or more specifically, at times t13 and t16. In response to this temporary turning on, the gate of the transistor M2 is reset, and a detection signal Sc having the signal level corresponding to the reset state (i.e., reference level) is output to the AD conversion portion 322.

The transistor M1a is turned off at time t11 and then temporarily turned on at time t14, immediately after the transistor M2 is temporarily turned on at time t13. As a result, the electric charge accumulated on the cathode of the second element E2a during the shutter release period from times t11 to t14 is transferred to the gate of the transistor M3, and a detection signal Sc having the signal level corresponding to the electric charge (i.e., detection level) is output to the AD conversion portion 322.

The transistor M1b is turned off at time t11 and then temporarily turned on at time t17, immediately after the transistor M2 is temporarily turned on at time t16. As a result, the electric charge accumulated on the cathode of the second element E2b during the shutter release period from times t11 to t17 is transferred to the gate of the transistor M3, and a detection signal Sc having the signal level corresponding to the electric charge (i.e., detection level) is output to the AD conversion portion 322.

When the transistor M2 is first temporarily turned on, or at time t13, the AD converter AD3 of the AD conversion portion 322 samples the reference level at which the cathode of the second element E2a is reset. Then, at time t14, when the transistor M1a is temporarily turned on, the AD converter AD3 samples the detection level indicating the electric charge accumulated on the second element E2a.

Similarly, when the transistor M2 is second temporarily turned on, or at time t16, the AD converter AD3 samples the reference level at which the cathode of the second element E2b is reset. Then, at time t17, when the transistor M1b is temporarily turned on, the AD converter AD3 samples the detection level indicating the electric charge accumulated on the second element E2b.

In other words, the two second elements E2a and E2b in the present embodiment are controlled by the rolling shutter method of exposing them at different points in time.

[2-5. Effects]

According to the second embodiment described in detail above, the effects (1a) to (1d) of the above first embodiment are achieved, and the following effect is also achieved.

(2a) In the present embodiment, the unit element block Ba includes not the second element E2 but the four second elements E2a to E2d, each of which is about a quarter the size of the second element E2. In the imaging mode, pixel values are read from each of the second elements E2a to E2d. Thus, according to the present embodiment, higher-definition captured images can be generated.

[2-6. Modification]

In the embodiment described above, after the start of the imaging period, the transistor M1b is turned off at time t11. However, the transistor M1b may be turned off at time t15 in FIG. 11. In this case, the electric charge accumulated on the cathode of the second element E2b during the shutter release period from times t15 to t17 is transferred to the gate of the transistor M3, and a detection signal Sc having the signal level corresponding to the electric charge (i.e., detection level) is output to the AD conversion portion 322. In other words, the second elements E2a and E2b may have shutter release periods of the same length.

3. Third Embodiment

[3-1. Differences from First Embodiment]

A third embodiment is basically similar to the first embodiment, and thus differences will now be described below. The same reference signs as in the first embodiment refer to the same components, for which the preceding description applies.

The third embodiment is different from the first embodiment in the absence of the scanning section 20 as well as a light emitting section 10a, a light receiving element array 31, and a unit circuit 321b.

[3-2. Light Emitting Section/Light Receiving Element Array]

Figure 12:
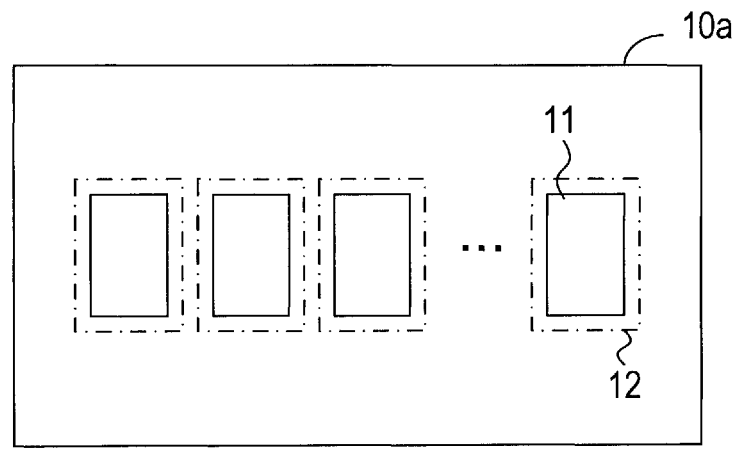
FIG. 12 illustrates a light emitting section according to a third embodiment.

As shown in FIG. 12, the light emitting section 10a includes a plurality of light emitting elements 11, and each of the light emitting elements 11 has a lens 12. Each lens 12 is set to send irradiation light from the corresponding light emitting element 11 in a different direction. In this example, M light emitting elements 11 and M lenses 12 are included. Each lens 12 is associated with any one of the M divisions of the sensing area, and set to send the irradiation light from the corresponding light emitting element 11 toward the corresponding division of the sensing area.

Although not shown, the light receiving element array 31 includes a plurality of unit element blocks B, and each unit element block has a lens as with the light emitting section 10a. In this example, M unit element blocks B and M lenses are included. Each lens is associated with any one of the M divisions of the sensing area, and allows its unit element block B to receive only the reflected light coming from the corresponding division of the sensing area.

[3-3. Unit Circuit]

Figure 13:
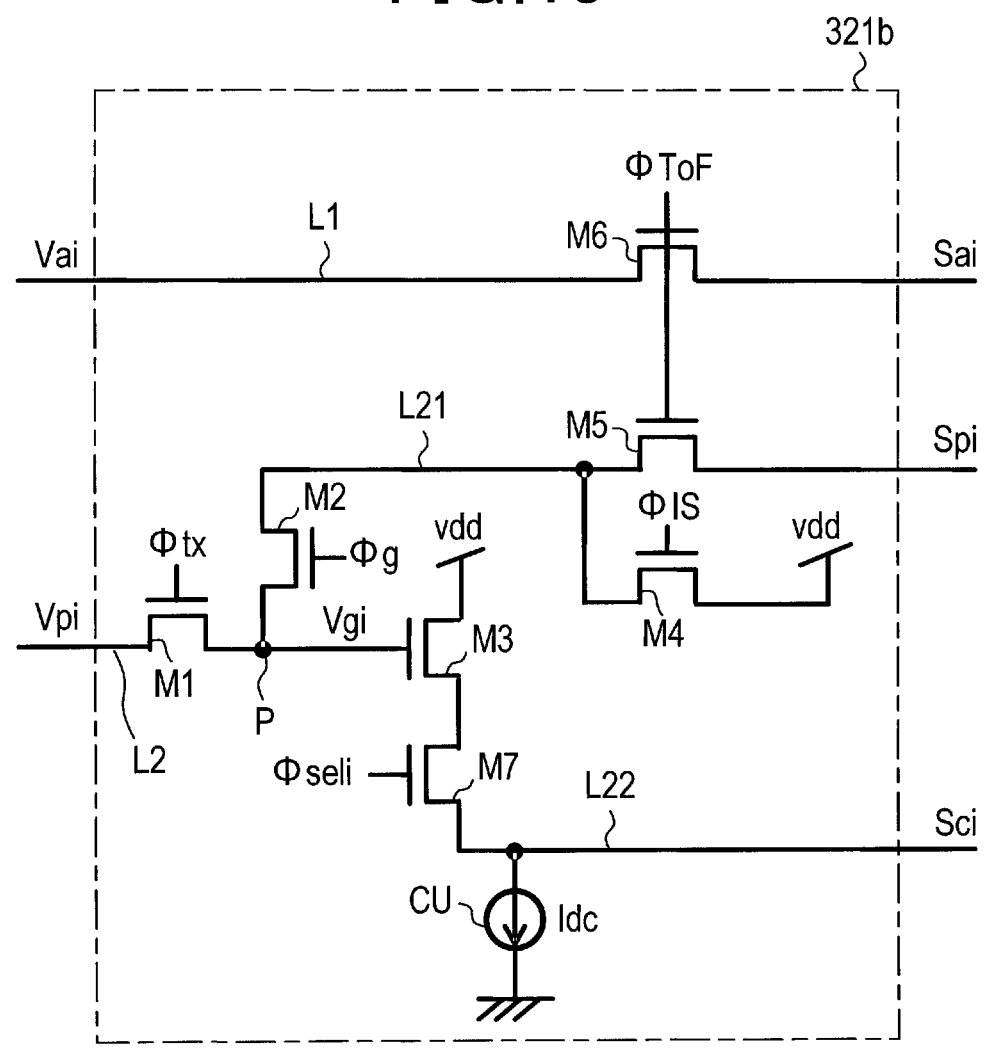
FIG. 13 is a circuit diagram illustrating a unit circuit according to the third embodiment.

As shown in FIG. 13, the unit circuit 321b is similar to the unit circuit 321 shown in FIG. 3, except for the inclusion of an additional transistor M7.

The transistor M7 is installed between the transistor M3 and the amplifier A3 for amplifying a detection signal Sci, and establishes or breaks the electrical connection through the path L21 in accordance with a control signal ϕseli. The letter i added at the ends of reference signs in FIG. 13 is an identifier that is a value ranging from 1 to M, and identifies different unit circuits 321b associated with the different unit element blocks B.

Figure 14:
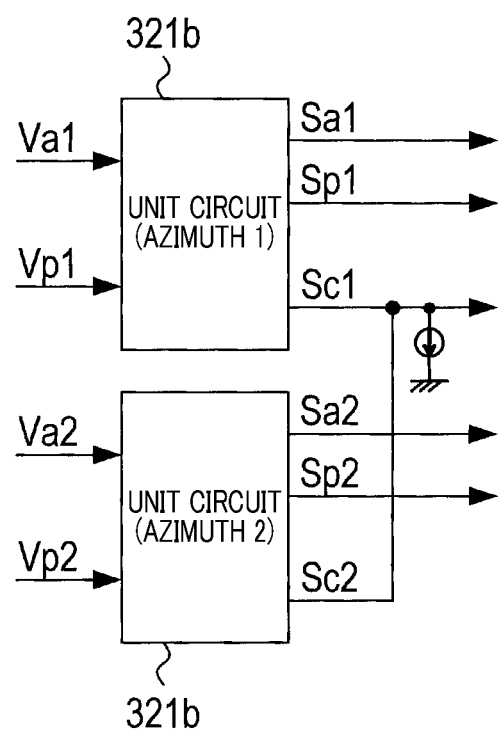
FIG. 14 is a block diagram illustrating example connection between unit circuits shown in FIG. 13.

With these unit circuits 321b, the control signal ϕseli allows the different unit circuits 321b to individually output a detection signal Sci. Thus, as shown in FIG. 14, the different unit circuits 321b may be connected to each other to share the amplifier and the AD converter for detection signals Sci, or the amplifier A3 and the AD converter AD3 in FIG. 3.

In this case, as described with reference to FIG. 11, the imaging period may be divided into the first and second halves to process a detection signal Sc1 for azimuth 1 in the first half and then a detection signal Sc2 for azimuth 2 in the second half.

[3-4. Effects]

According to the third embodiment described in detail above, the effects (1a) to (1c) of the above first embodiment are achieved, and the following effects are also achieved.

(3a) According to the third embodiment, the different unit circuits 321b can share the amplifier and the AD converter that process detection signals Sci, thus preventing an increase in the circuit scale of the AD conversion portion 322.

(3b) According to the third embodiment, the lenses placed on the light emitting section 10a and the light receiving element array 31 enable a scan without the scanning section 20, which uses a mechanical method. The size of the apparatus can thus be reduced.

4. Fourth Embodiment

[4-1. Differences from First Embodiment]

A fourth embodiment is basically similar to the third embodiment, and thus differences will now be described below. The same reference signs as in the third embodiment refer to the same components, for which see the preceding description.

The fourth embodiment is different from the first embodiment in a unit circuit 321c and the control performed by the drive control unit 51.

[4-2. Unit Circuit]

Figure 15:
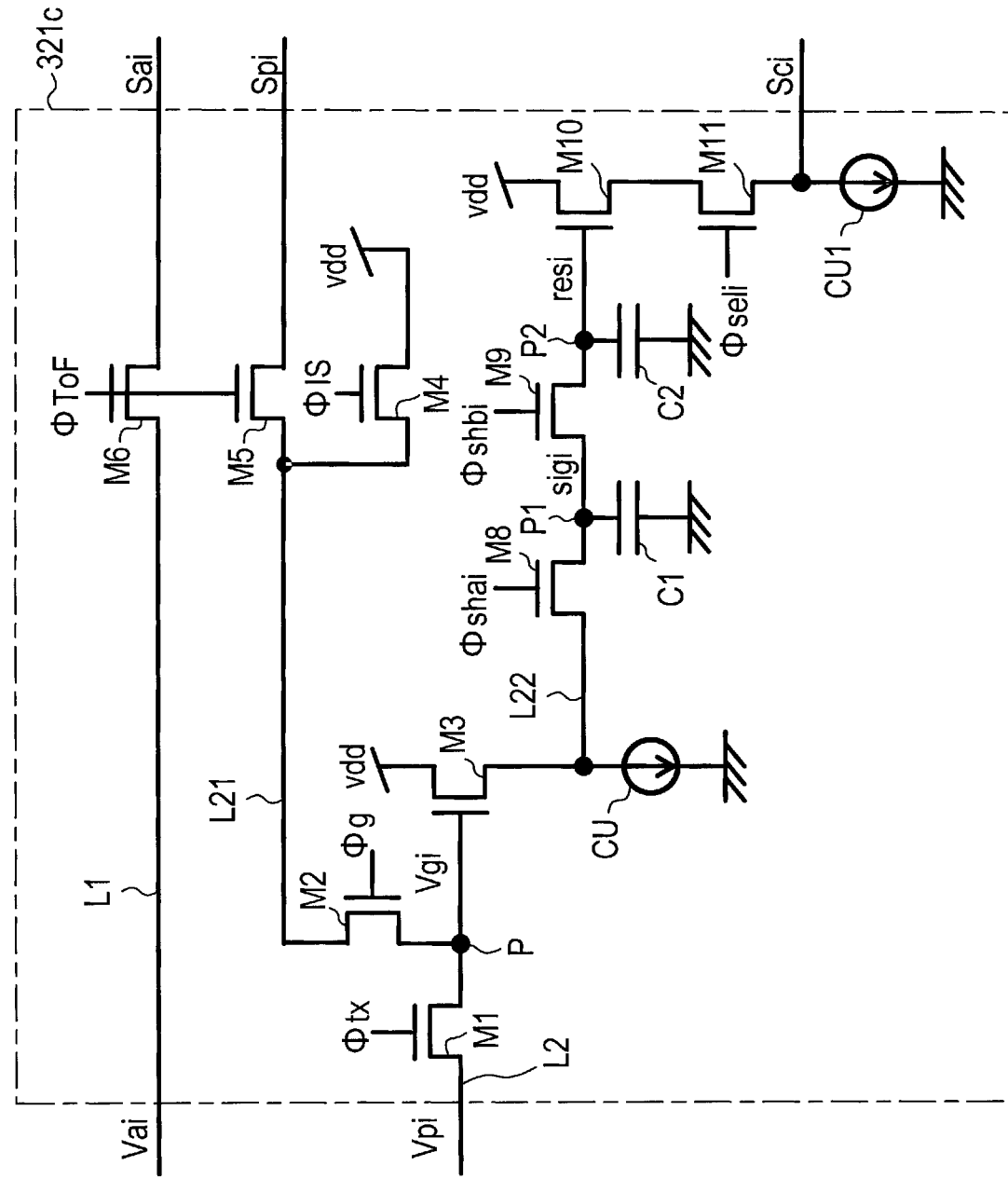
FIG. 15 is a circuit diagram illustrating a unit circuit according to a fourth embodiment.
Figure 16:
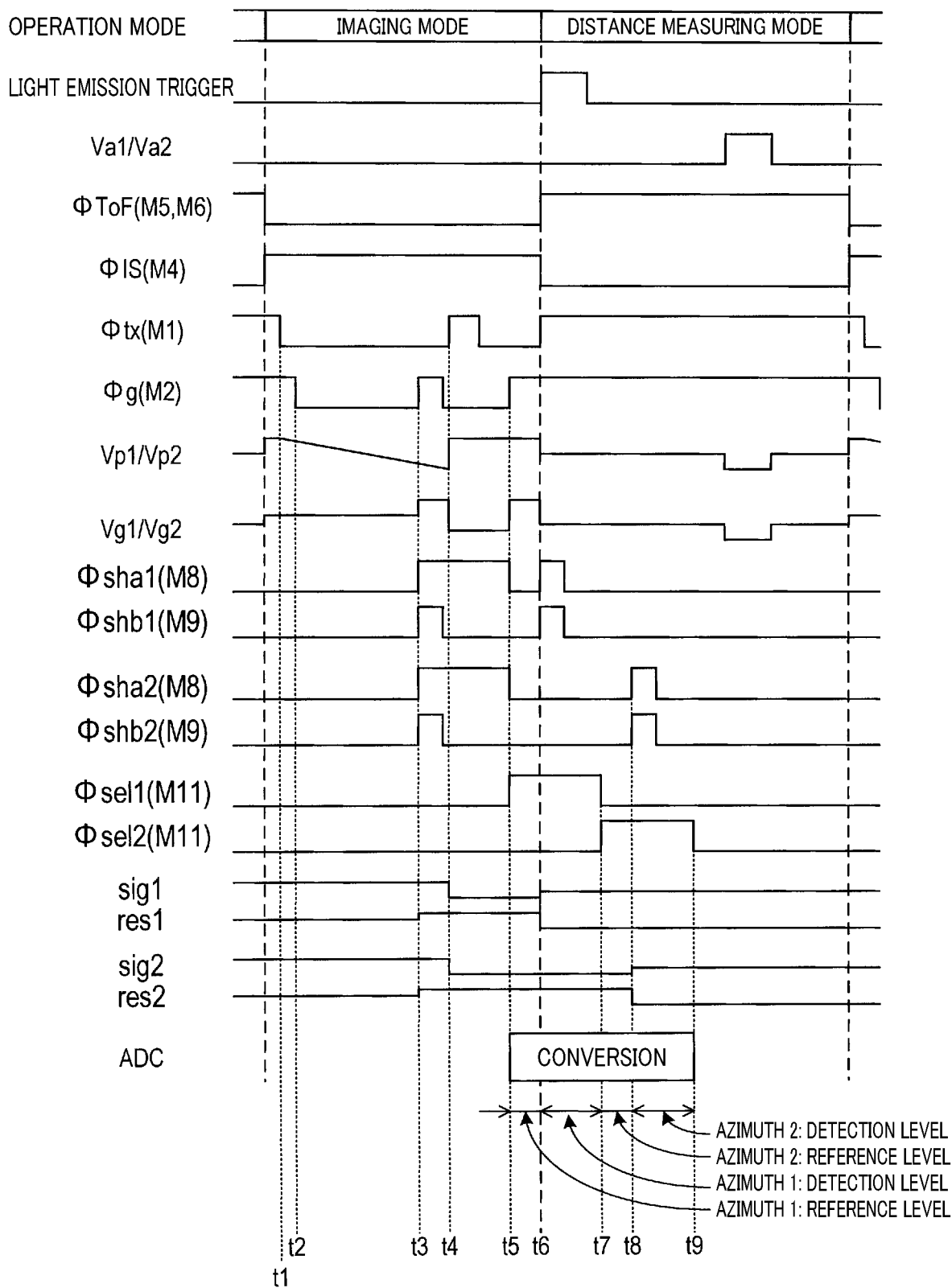
FIG. 16 is a timing chart illustrating the operation of a readout unit according to the fourth embodiment.

As shown in FIG. 15, the unit circuit 321c is similar to the unit circuit 321 shown in FIG. 3, except for the inclusion of additional components: transistors M8 to M11, capacitors C1 and C2, and a constant current circuit CU1.

All of these components are installed on the path L22 downstream from the transistor M3. Among the additional components, the transistors M8 and M9, and the capacitors C1 and C2 correspond to a holding circuit.

The capacitors C1 and C2 are connected to the path L22 and ground between the transistor M3 and the amplifier A3 for amplifying detection signals Sci. Hereinafter, the connection point between the capacitor C1 and the path L22 is referred to as a shift point P1, and the connection point between the capacitor C2 and the path L22 is referred to as a shift point P2.

The transistor M8 is installed between the transistor M3 and the shift point P1, and establishes or breaks the electrical connection through the path L22 in accordance with a control signal ϕshai.

The transistor M9 is installed between the shift points P1 and the shift point P2, and establishes or breaks the electrical connection through the path L22 in accordance with a control signal ϕshbi.

The transistor M10 amplifies a signal level resi at the shift point P2 and outputs the amplified signal as a detection signal Sci.

The transistor M11 is installed between the transistor M10 and the amplifier A3, and establishes or breaks the electrical connection through the path L22 in accordance with a signal ϕseli.

The constant current circuit CU1 applies a bias current to the transistor M10.

In the unit circuit 321c with this structure, the electric charge accumulated on the cathode of the second element E2 can be stored in the capacitor C1 and the capacitor C2 by a bucket brigade method.

[4-3. Drive Control Unit]

The control performed by the drive control unit 51 will now be described. It is noted that as shown in FIG. 14, two unit circuits 321c are connected to each other to share an amplifier and an AD converter that process detection signals Sci.

In the imaging mode, the transistors M1, M2, and M4 to M6 in each of the unit circuits 321c are turned on and off in the same manner as in the first embodiment. This on-off control allows the potential Vpi at the cathode of the second element E2 to have the same waveform, and also allows the potential Vgi at the gate of the transistor M3 to have the same waveform.

At time t3, the transistor M2 and the transistors M8 and M9 are turned on at the same time, and the potentials at the shift points P1 and P2 are reset. Then, the transistor M9 is turned off together with the transistor M2 immediately before time t4, while the transistor M8 remains on until time t5.

At time t4, when the transistor M1 is temporarily turned on, the electric charge accumulated on the cathode of the second element E2 (i.e., potential Vpi) is transferred to the gate of the transistor M3, and the gate signal level Vgi at this time is amplified by the transistor M3 to charge the capacitor C1. Then, at time t5, when the transistor M8 is turned off, the signal level corresponding to the electric charge accumulated on the second element E2 is stored in the capacitor C1.

The two unit circuits 321c perform the same control so far and different controls from this time forward.

At time t5, the transistor M11 of the unit circuit 321c for processing azimuth 1 (hereinafter, the first unit circuit) is turned on. Then, in the first unit circuit, a signal level res1 stored in the capacitor C2 is amplified by the transistor M10 and output as a detection signal Sc1. The signal level of the detection signal Sc1 is sampled by the AD converter as a reference level for azimuth 1. The transistor M11 remains on until time t7.

At time t6, when the imaging mode is switched to the distance measuring mode, the transistors M8 and M9 of the first unit circuit are temporarily turned on. Then, in the first unit circuit, a signal level sig1 stored in the capacitor C1 is transferred to the capacitor C2, amplified by the transistor M10, and output as a detection signal Sc1. The signal level of the detection signal Sc1 is sampled by the AD converter as a detection level for azimuth 1.

At time t7, the transistor M11 of the first unit circuit is turned off, while the transistor M11 of the unit circuit 321c for processing azimuth 2 (hereinafter, the second unit circuit) is turned on. Then, in the second unit circuit, a signal level res2 stored in the capacitor C2 is amplified by the transistor M10 and output as a detection signal Sc2. The signal level of the detection signal Sc2 is sampled by the AD converter as a reference level for azimuth 2. The transistor M11 remains on until time t9.

At time t8, the transistors M8 and M9 of the second unit circuit are temporarily turned on. At this time, in the second unit circuit, a signal level sig2 stored in the capacitor C1 is transferred to the capacitor C2, amplified by the transistor M10, and output as a detection signal Sc2. The signal level of the detection signal Sc2 is sampled by the AD converter as a detection level for azimuth 2.

[4-4. Effects]

According to the fourth embodiment described in detail above, the effects (1a) to (1c), (3a), and (3b) of the above first embodiment are achieved, and the following effect is also achieved.

(4a) In the fourth embodiment, the capacitor C2 stores the reference level, and the capacitor C1 stores the detection level. Thus, a detection signal Sc can be read out at any time irrespective of the imaging period, thus increasing the control flexibility.

5. Fifth Embodiment

[5-1. Differences from First Embodiment]

A fifth embodiment is basically similar to the first embodiment, and thus differences will now be described below. The same reference signs as in the first embodiment refer to the same components, for which see the preceding description.

The fifth embodiment is different from the first embodiment in the operation mode switching by the mode setting unit 52.

[5-2. Mode Setting Unit]

Figure 17:
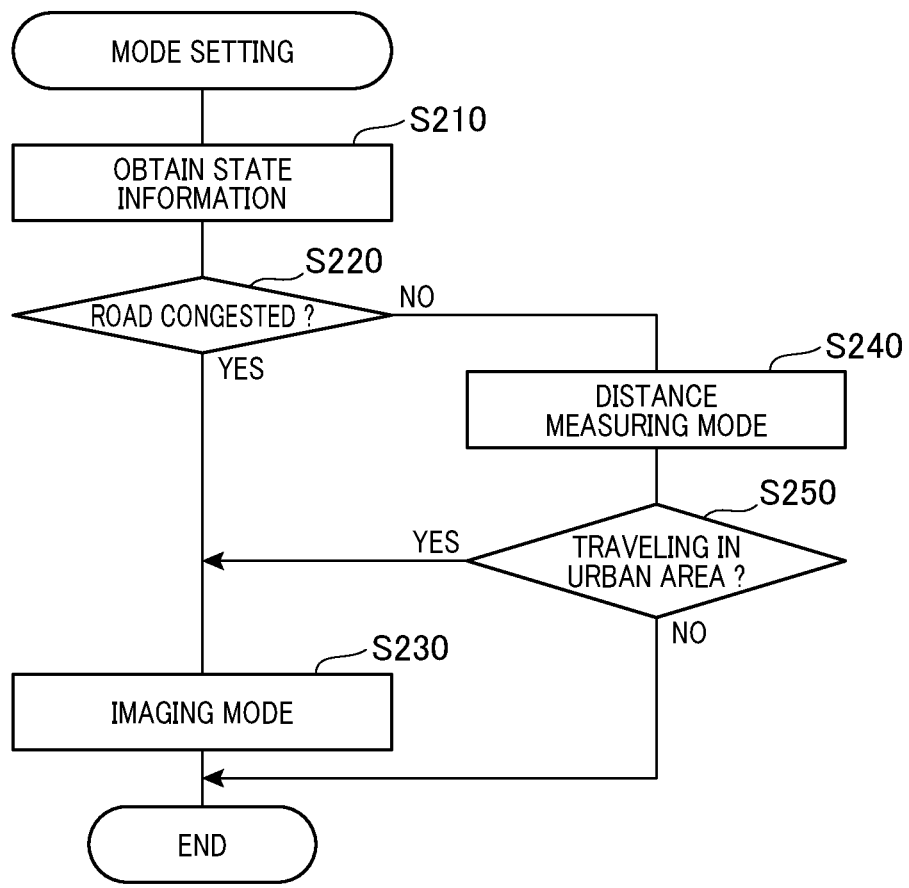
FIG. 17 is a flowchart of a mode setting procedure according to a fifth embodiment.

The procedure performed by the mode setting unit 52 will now be described with reference to the flowchart shown in FIG. 17.

This procedure is repeated.

When this procedure is started, in S210, the mode setting unit 52 obtains information including the traffic jam information and the vehicle speed V via the information obtaining section 40.

In S220, the mode setting unit 52 determines whether the road being traveled by the vehicle is congested, based on the traffic jam information obtained in S210. This congestion determination may be based on the detection results from the target detection unit 53. If the result is positive in S220, the mode setting unit 52 proceeds to S230. If the result is negative, the mode setting unit 52 proceeds to S240.

In S240, the mode setting unit 52 sets the operation mode at the distance measuring mode to scan the overall sensing area. As a result, the distance measurement unit 33 gives a range image indicating the distance to a target within the sensing area.

In S250, the mode setting unit 52 determines whether the vehicle is traveling in an urban area based on the information obtained in S210. If the result is positive in S250, the mode setting unit 52 proceeds to S230. If the result is negative, the mode setting unit 52 finishes the procedure.

This urban area determination may be based on, for example, whether the speed V is equal to or lower than a preset threshold Vth. In some cases, the determination may also be based on not only the instantaneous speed, but also changes in the speed over time. More specifically, the determination may be based on whether vehicle speeds are equal to or lower than the threshold Vth for at least a predetermined time. The detection results from the target detection unit 53 may also be used for the determination.

In S230, the mode setting unit 52 sets the operation mode at the imaging mode to scan the overall sensing area, and then finishes the procedure. As a result, the image generation unit 34 gives a captured image of the sensing area.

Figure 18:
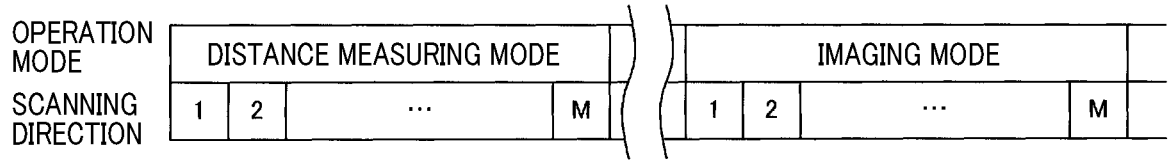
FIG. 18 illustrates the relationship between operation modes and scanning directions.

Under the mode setting procedure in the present embodiment, as shown in FIG. 18, the operation modes are switched each time the overall sensing area is scanned, or more specifically, each time all the azimuths from azimuth 1 to azimuth M are sequentially processed in the same operation mode.

While the road is congested, only the imaging mode is repeated. The detection focuses on relatively near targets. While the road is not congested and the vehicle is traveling in an urban area, the distance measuring mode and the imaging mode are alternated, and near targets and distant targets are detected evenly. While the road is not congested or the vehicle is not traveling in an urban area, the vehicle is estimated to be traveling on an expressway, and only the distance measuring mode is repeated. The detection focuses on relatively distant targets.

Although one operation mode may be repeated depending on the situation, the operation mode may enter both the modes in different ratios.

[5-3. Effects]

According to the fifth embodiment described in detail above, the effects (1a) to (1d) of the above first embodiment are achieved, and the following effect is also achieved.

(5a) In the fifth embodiment, the operation mode is selected as appropriate to the situation, and thus information appropriate to the situation can be detected efficiently.

6. Other Embodiments

Although the embodiments of the present disclosure have been described, the present disclosure is not limited to the above embodiments and may be modified variously.

Figure 19:
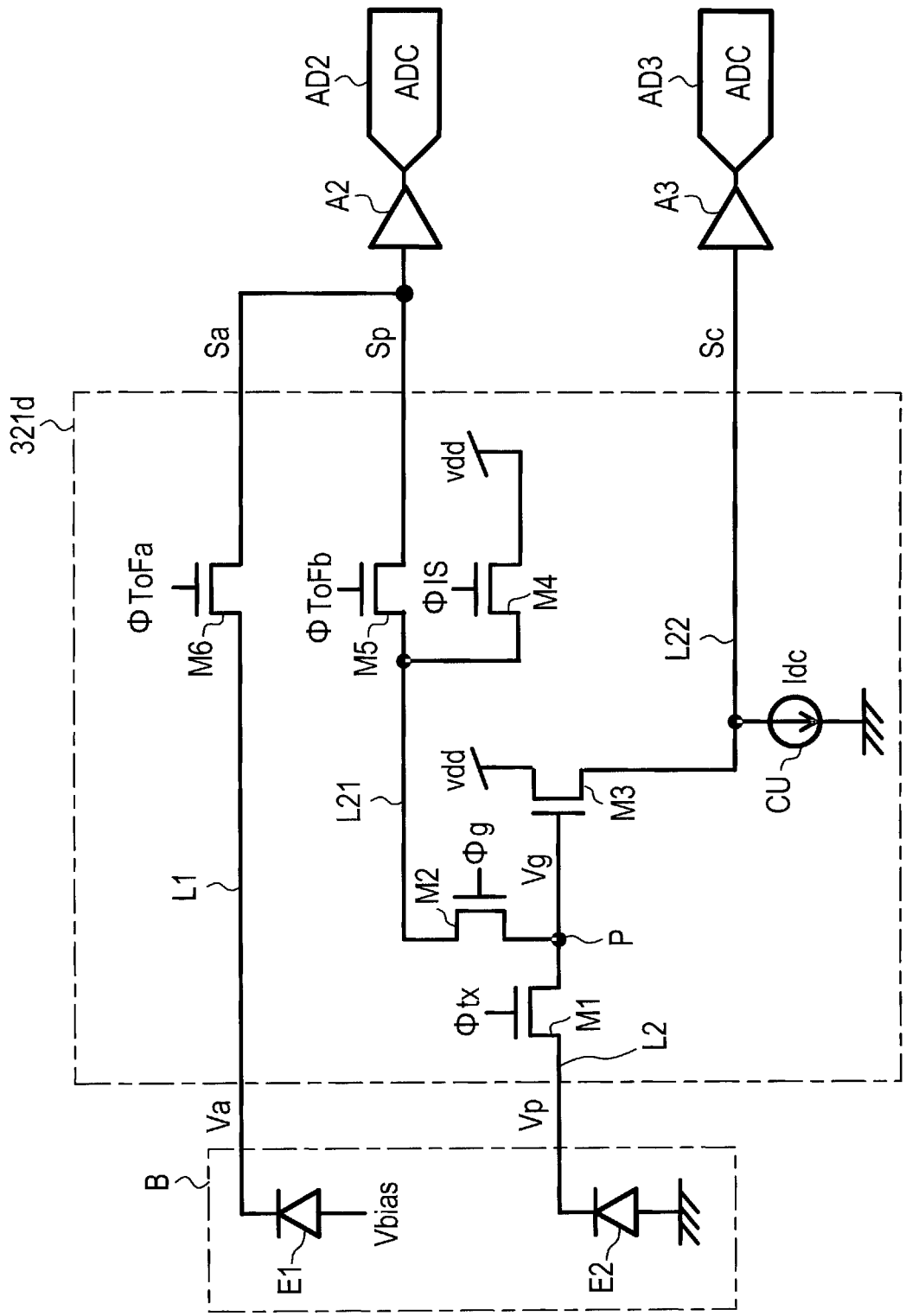
FIG. 19 is a circuit diagram illustrating a modification of the unit circuit.

(6a) In the embodiments described above, the separate AD converters AD1 and AD2 are used for sampling the detection signal Sa and the detection signal Sp. However, as shown in FIG. 19, one AD converter AD2 may be used for sampling both the detection signals Sa and Sp. In this case, the transistors M5 and M6 in a unit circuit 321d may be individually controlled with different control signals φTOFa and φTOFb in place of the common control signal φTOF. In this structure, the first element E1 and the second element E2 included in the same unit element block B cannot be used at the same time in the distance measuring mode, and any one of them is selected for processing. More specifically, the first element E1 in use may be switched to the second element E2 in response to the detection of the saturation of the detection signal Sa. The second element E2 in use may be switched to the first element E1 in response to the detection of the detection signal Sp with its peak value equal to or lower than a threshold.

Figure 20:
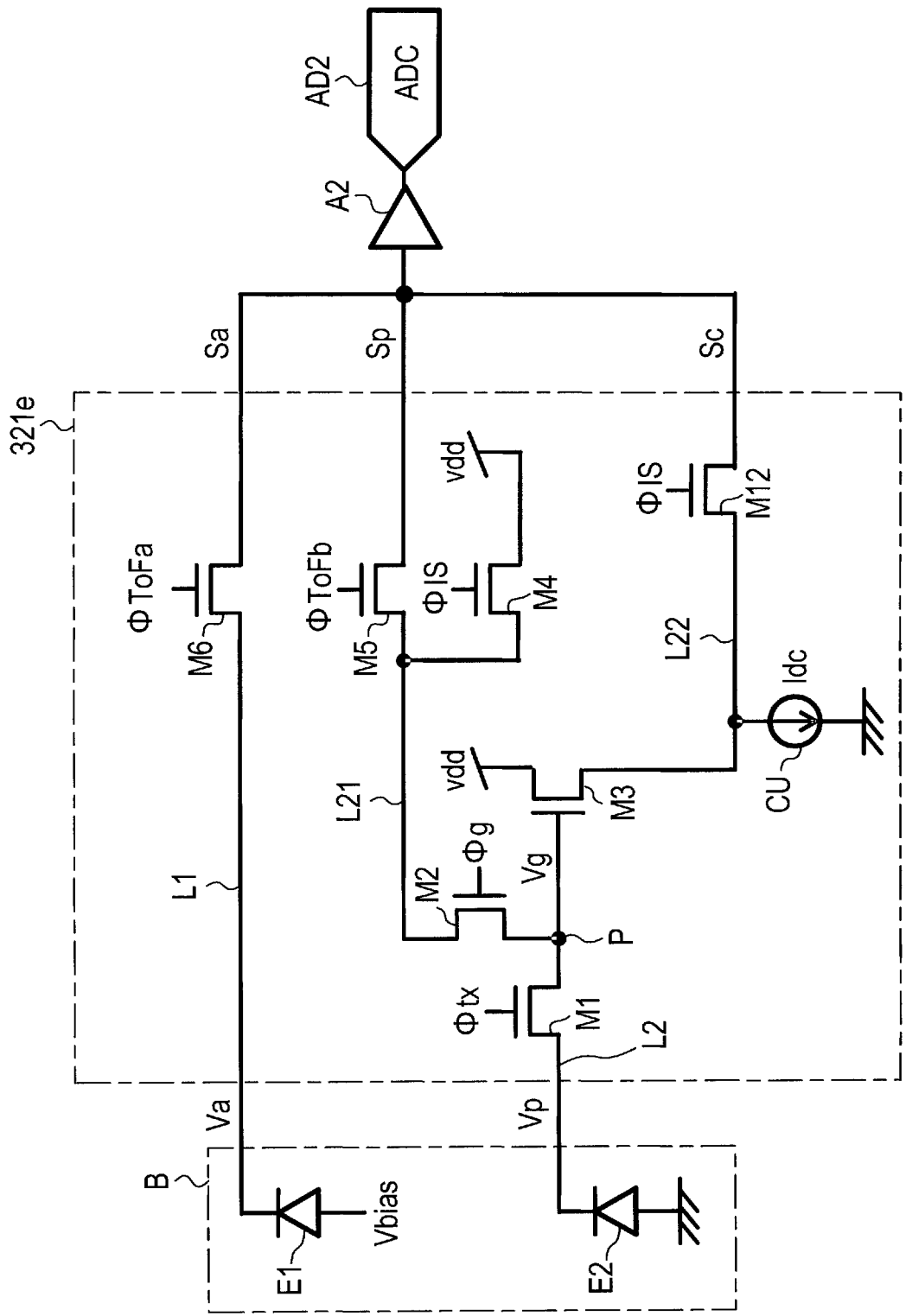
FIG. 20 is a circuit diagram illustrating another modification of the unit circuit.

(6b) Additionally, as shown in FIG. 20, the detection signal Sc may also be received by one AD converter AD2. In this case, a unit circuit 321e has the structure of the unit circuit 321d shown in FIG. 19 and additionally includes a transistor M12. The transistor M12 is installed downstream from a transistor M3, and establishes or breaks the electrical connection through the path L22 in accordance with a control signal φIS. In this control, any one of the transistors M5, M6, and M12 may be turned on.

(6c) Different functions of one component in the above embodiments may be implemented by different components, or one function of one component may be implemented by different components. Different functions of different components may be implemented by one component, or one function implemented by different components may be implemented by one component. Some components may be omitted from the above embodiments. At least some components in one of the above embodiments may be added to or substituted for components in another of the embodiments. A wide variety of aspects within the technical idea specified in claims are embodiments of the present disclosure.

(6d) In addition to the light receiving element array and the light detection apparatus described above, the present disclosure may be embodied in various forms such as a system including the light receiving element array or the light detection apparatus as a component. For example, the light receiving element array or the light detection apparatus may be used as an object detection apparatus for a driving support system or an automated driving system. The driving support system may be adapted to implement at least one of collision avoidance assistance, lane keeping assistance, traffic sign recognition assistance, lane changing assistance, and lighting control. These functions are implemented based on information detected by the object detection apparatus, such as the positions and the moving speeds of various targets near the vehicle equipped with the system. The automated driving system may also be adapted to implement at least one of the calculation of the path of the vehicle equipped with the system (i.e., positions on the road), collision avoidance control, lane keeping control, lane changing control, and lighting control based on information from the object detection apparatus.

What is claimed is:

1. A light detection apparatus comprising:
a light emitting section configured to emit light to a preset sensing area;
a light receiving element array including one or more unit element blocks configured to receive light coming from the sensing area, the unit element blocks each having a first element which is a photodiode with an electron multiplying function and a second element which is a photodiode without the electron multiplying function;
a distance measurement unit configured to measure a distance using a detection signal read from the light receiving element array;
an image generation unit configured to generate an image using a detection signal from the light receiving section;
a mode setting unit configured to set an operation mode to any one of a distance measuring mode and an imaging mode; and
a readout unit configured to, in response to the operation mode being set to the distance measuring mode, cause each of the first element and the second element to output a detection signal corresponding to received light intensity to the distance measurement unit, and in response to the operation mode being set to the imaging mode, output to the image generation unit, a detection signal indicating an amount of electric charge accumulated on the second element during a preset shutter release period, wherein
the light emitting section operates when the operation mode is the distance measuring mode.

2. The light detection apparatus according to claim 1, wherein
the distance measurement unit determines whether a first signal being a detection signal from the first element is saturated, and uses the first signal for unsaturation or a second signal for saturation, the second signal being a detection signal from the second element, to determine a distance to a target having reflected irradiation light from the light emitting section.

3. The light detection apparatus according to claim 1, further comprising:
a scanning section configured to sequentially cause light arriving in different directions to enter the light receiving element array.

4. The light detection apparatus according to claim 1, wherein
the readout unit further includes a holding circuit configured to hold a detection signal of the second element operating in the imaging mode, and outputs the detection signal held in the holding circuit to the image generation unit.

5. The light detection apparatus according to claim wherein
the light detection apparatus is installed in a vehicle, and further includes an information obtaining section configured to obtain information indicating at least one of behavior of the vehicle and an environment around the vehicle, and
the mode setting unit switches between the operation modes in accordance with the information obtained by the information obtaining section.

6. The light detection apparatus according to claim 5, wherein
in response to the vehicle being estimated to be traveling on an expressway from the information obtained by the information obtaining section, the mode setting unit increases a set ratio of the distance measuring mode.

7. The light detection apparatus according to claim 5, wherein
in response to a road being traveled is estimated to be congested from the information obtained by the information obtaining section, the mode setting unit increases a set ratio of the imaging mode.

8. The light detection apparatus according to claim 1, further comprising:
an intensity control unit configured to obtain information indicating a type of a target sensed within the sensing area, and reduce a light emission intensity of the light emitting section when the obtained information indicates presence of a pedestrian.

9. A driving support system comprising a light detection apparatus according to claim 1.

10. An automated driving system comprising a light detection apparatus according to claim 1.

* * * * *